United States Patent [19]

Odagiri

[11] Patent Number: 4,884,279

[45] Date of Patent: Nov. 28, 1989

[54] OPTICAL TRANSMISSION APPARATUS

[75] Inventor: Yuichi Odagiri, Tokyo, Japan

[73] Assignee: NEC Corporation, Japan

[21] Appl. No.: 185,023

[22] Filed: Apr. 22, 1988

[30] Foreign Application Priority Data

Apr. 23, 1987 [JP] Japan .................................. 62-98563

[51] Int. Cl.[4] .............................................. H01S 3/13
[52] U.S. Cl. ........................................ 372/29; 372/38; 372/34
[58] Field of Search ...................... 372/29, 36, 38, 34; 250/238

[56] References Cited

U.S. PATENT DOCUMENTS

| 4,338,577 | 7/1982 | Sato et al. | 372/36 |
| 4,399,541 | 8/1983 | Kovats | 372/36 |
| 4,547,885 | 10/1985 | Allen et al. | 372/58 |
| 4,571,728 | 2/1986 | Yoshikawa | 372/36 |
| 4,689,659 | 8/1987 | Watanabe | 372/36 |
| 4,695,714 | 9/1987 | Kimizuka et al. | 250/238 |
| 364,727,554 | 2/1988 | Watanabe | 372/36 |

Primary Examiner—Leon Scott, Jr.
Attorney, Agent, or Firm—Leydig, Voit & Mayer

[57] ABSTRACT

An optical transmission apparatus is operable without being effected by ambient temperature by combining the control over output light of a semiconductor light emitting element, which constitutes a semiconductor laser unit, and the control over the temperature of the light emitting element. The apparatus is usable in an extended range of ambient temperatures.

19 Claims, 6 Drawing Sheets

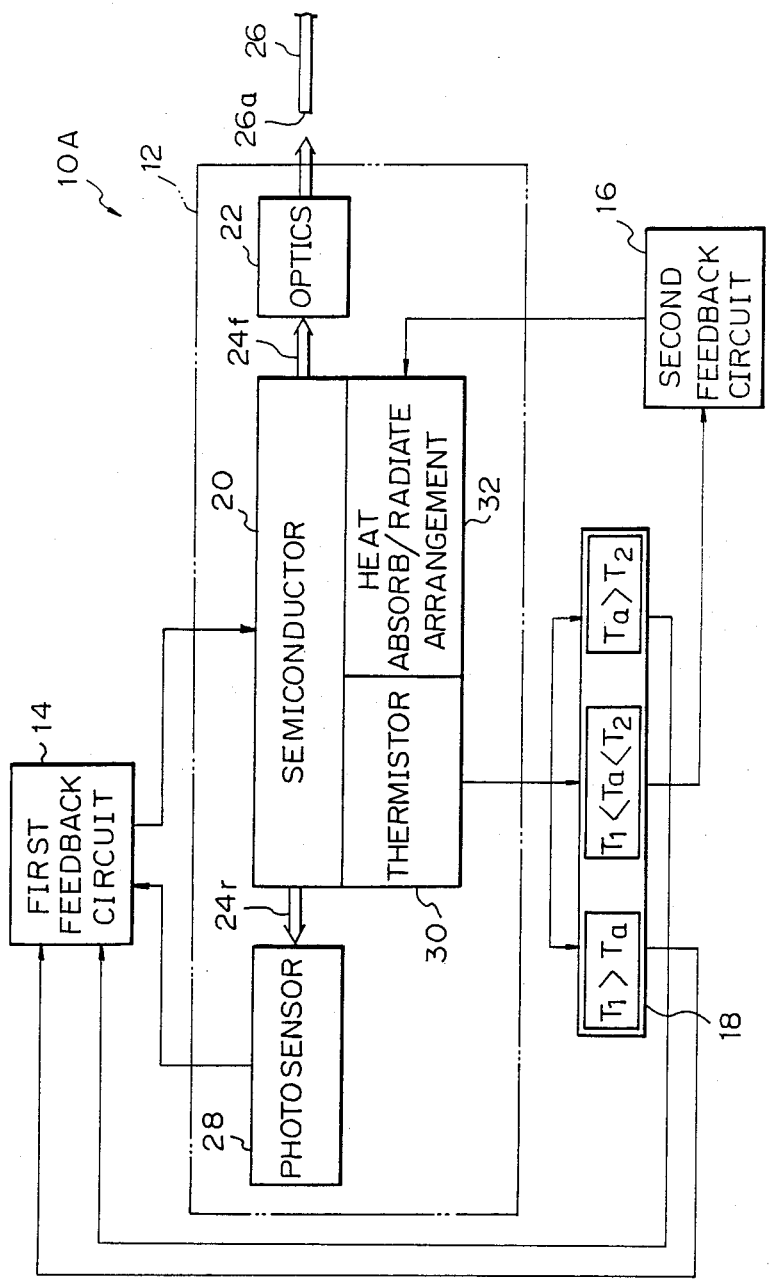

OPTICAL TRANSMISSION APPARATUS

BACKGROUND OF THE INVENTION

The present invention relates to an optical transmission apparatus which is operable stably without being effected by ambient temperature.

A prerequisite with an optical transmission apparatus is that a beam issuing from a semiconductor laser or like light source be incident to an optical fiber, which defines a transmission path, while being maintained at a predetermined intensity level despite any variation of ambient temperature. One approach to meet such a prerequisite is sensing and controlling the optical output of the light source itself, as disclosed in U.S. Pat. No. Re. 31,969. Another approach is maintaining the temperature of the light source itself constant, as shown and described in U.S. Pat. No. 4,338,577. Specifically, the light source output sense and control scheme is such that light emanating from the opposite side of a semiconductor laser to the side which is connected to an optical fiber is sensed by a photosensor to so control a bias current applied to the laser as to maintain the average optical input to the optical fiber constant. This kind of scheme, however, has a problem that the current threshold of the laser varies with temperature. On the other hand, the light source temperature control scheme is such that the temperature of a semiconductor laser is sensed by a temperature sensor to so control the current being fed to a light absorbing and radiating arrangement as to maintain the temperature of the laser constant. Generally referred to as a thermoelectric cooler, the heat absorbing and radiating arrangement is implement by those elements which use, among various thermoelectric effects known in the art, the Peltier effect. Various efforts heretofore made to implement high quality and stable optical transmission rely on either one of the above-stated two different approaches.

A problem with using any of the above two approaches as it is that the ambient temperature range in which an optical transmission apparatus is usable would be limited and, therefore, the apparatus would fail to desirably operate under severe environmental conditions. A semiconductor laser, for example, is operable only in a temperature range which is usually 0° C. to 60° C. Specifically, at temperatures above 60° C., the tendency of the optical output to drive current characteristic to become saturated due to the temperature dependence of external differential quantum efficiency is noticeably aggravated and, in addition, the tendency of the current threshold to increase is sped up. These in combination prevents a high optical output from being maintained and thereby renders the apparatus unfeasible for use in high temperature environments. On the other hand, at temperatures below 0° C. which are lower than the dew point, decision regarding a kink at a laser device level is difficult; a kink would cause the optical output to become unstable thereabouts. When use is made of the previously mentioned heat absorbing and radiating arrangement, the permissible difference between the ambient temperature and the temperature of a semiconductor laser is up to 40° to 45° C. Hence, assuming that the temperature of a semiconductor laser itself is 25° C., the upper limit of permissible ambient temperatures is substantially 65° C. to 70° C. Further, since such an arrangement needs an extra current source of about 1 ampere and consumes substantial power, some implementation has to be provided to reduce power consumption as far as possible.

SUMMARY OF THE INVENTION

It is therefore an object of the present invention to provide an optical transmission apparatus capable of operating with stability even under severe environmental conditions.

It is another object of the present invention to provide a generally improved optical transmission apparatus.

Accordingly, the present invention provides an optical transmission apparatus comprising a light emitting device, a light controller, a temperature sensor, a temperature controller, and decision circuitry. The light emitting device emits coherent light. The light controller includes a first feedback circuit and a photo sensor for stabilizing the light emitted by the light emitting device by sensing at least a part of the emitted light. The temperature sensor senses the temperature of the light emitting device. The temperature controller includes a second feedback circuit and a heat transfer device and is responsive to the temperature sensed by the temperature sensor for controlling the temperature of the light emitting device. The decision circuitry identifies one of three different stages to which the temperature of the light emitting device belongs and information from the decision circuitry is fed to at least one the first and second feedback circuits to stabilize the output of the light emitting device.

The present invention also provides an optical transmission apparatus comprising a light emitting device, a first control arrangement, a heat transfer device, and a second control arrangement. The light emitting device emits coherent light. The first control arrangement includes a first feedback circuit and a photo sensor coupled to the light emitting device to stabilize the light output by the light emitting device when the temperature is within a predetermined range. The heat transfer device is thermally coupled to the light emitting device. The second control arrangement includes a temperature sensor thermally coupled to the light emitting device and a second feedback circuit coupled to the heat transfer device so the heat transfer device supplies heat to the light emitting device when the temperature is below the predetermined range, removes heat from the light emitting device when the temperature is above the predetermined range, and in inoperative when the temperature is within the predetermined range.

The present invention further provides an optical transmission apparatus comprising a light emitting device, a photo sensor, a temperature sensor, a heat transfer device, and a control arrangement. The light emitting device emits coherent light. The photo sensor is optically coupled to the light emitting device for sensing at least a part of the emitted light. The temperature sensor is thermally coupled to the light emitting device for sensing the temperature of the light emitting device. The heat transfer device is thermally coupled to the light emitting device for supplying heat to the light emitting device and for removing heat from the light emitting device. The control arrangement includes decision circuitry connected to the temperature sensor for determining whether the sensed temperature is below, within, or above the predetermined temperature range and a first feedback circuit coupled to the photo sensor and the light emitting device and a second feedback circuit coupled to the heat transfer device for stabilizing the light emitted by the light emitting device, causing the heat transfer device to supply heat to the light emitting device and causing the heat transfer device to remove heat from the light emitting device in accordance with the determination of the decision circuitry.

BRIEF DESCRIPTION OF THE DRAWINGS

The above and other objects, features and advantages of the present invention will become more apparent from the following detailed description taken with the accompanying drawings in which:

FIG. 6 is a schematic block diagram showing a second embodiment of the present invention.

DESCRIPTION OF THE PREFERRED EMBODIMENTS

Figure 1:
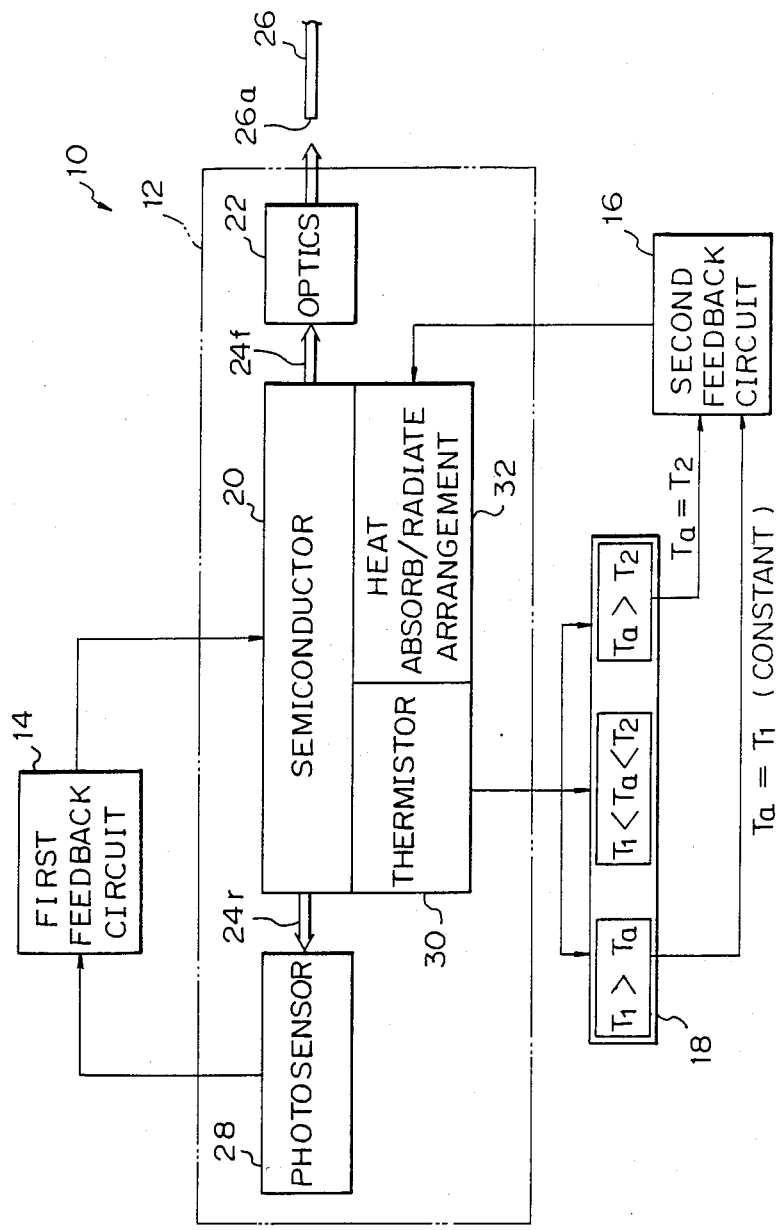
FIG. 1 is a schematic block diagram of a first embodiment of the optical transmission apparatus in accordance with the present invention.
Figure 2:
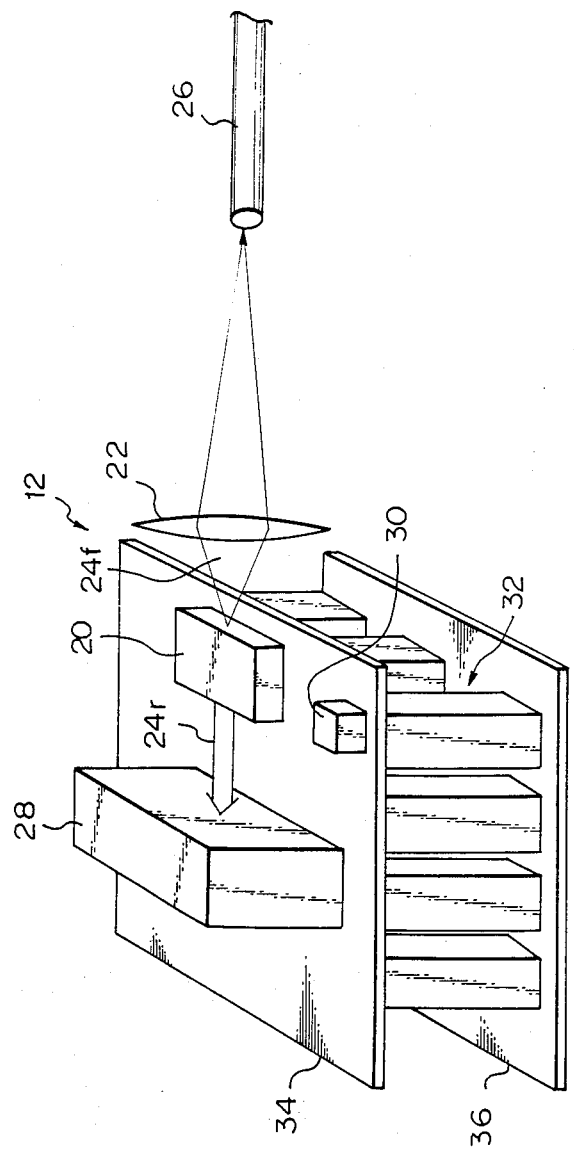
FIG. 2 is a perspective view of an optical module included in the apparatus of FIG. 1.

Referring to FIG. 1 of the drawings, an optical transmission apparatus embodying the present invention is shown and generally designated by the reference numeral 10. As shown, the apparatus 10 is generally made up of an optical module 12 for emitting a beam, and a controller which includes a first feedback circuit 14 adapted to stabilize the beam issuing from the optical module 12, a second feedback circuit 16 and a decision circuit 18. The optical module 10 is constituted by a semiconductor laser unit or light source 20, optics 22 for focusing a beam 24f which issues foward from the laser unit 20 onto an input end 26a of an optical fiber 26, a photosensor 28 sensitive to a beam 24r which issues rearward from the laser unit 20, a thermistor or temperature sensor 30 sensitive to ambient temperature, a heat absorbing and radiating arrangement 32 which comprises Peltier-effect elements for heating and cooling the laser unit 20. More specifically, as shown in FIG. 2, the laser unit 20, thermistor 30 and photosensor 28 are individually soldered to a heat absorbing end plate 34. A heat radiating end plate 36 is located to face the heat absorbing end plate 34 while Peltier-effect elements which constitute the arrangement 32 is interposed between and fixed to the opposite end plates 34 and 36.

The first feedback circuit 14 functions to control the laser unit 20 such that the rearward beam 24r issuing from the laser unit 20 remains at a constant intensity level without being affected by ambient temperature Ta. Since the threshold current $I_{th}$ of the laser 20 which is represented by $I_{th} \alpha \exp(Ta/To)$ is variable with the ambient temperature Ta, a drive current in the first feedback circuit 14 is selectively increased and decreased to maintain the optical output constant. Here, To is representative of a constant which is dependent upon the laser unit 20 as well as how the unit 20 is mounted; it reaches an inflection point when the ambient temperature Ta is about 50° C. to 60° C. and sharply decreases as the latter exceeds such a range. This means that at temperatures above 60° C. the drive current has to be greatly increased. In the light of this, the first feedback circuit 14 is constructed such that the upper limit $T_2$ of ambient temperature Ta is 60° C. and, considering the reliability of operation, the lower limit $T_1$ which does not cause a kink is 0° C. Hence, the effective temperature range of the first feedback circuit 14 is 0° C. to 60° C. The thermistor, or temperature sensor, 30 is adapted to sense the upper limit of 60° C. and the lower limit of 0° C.

Figure 3:
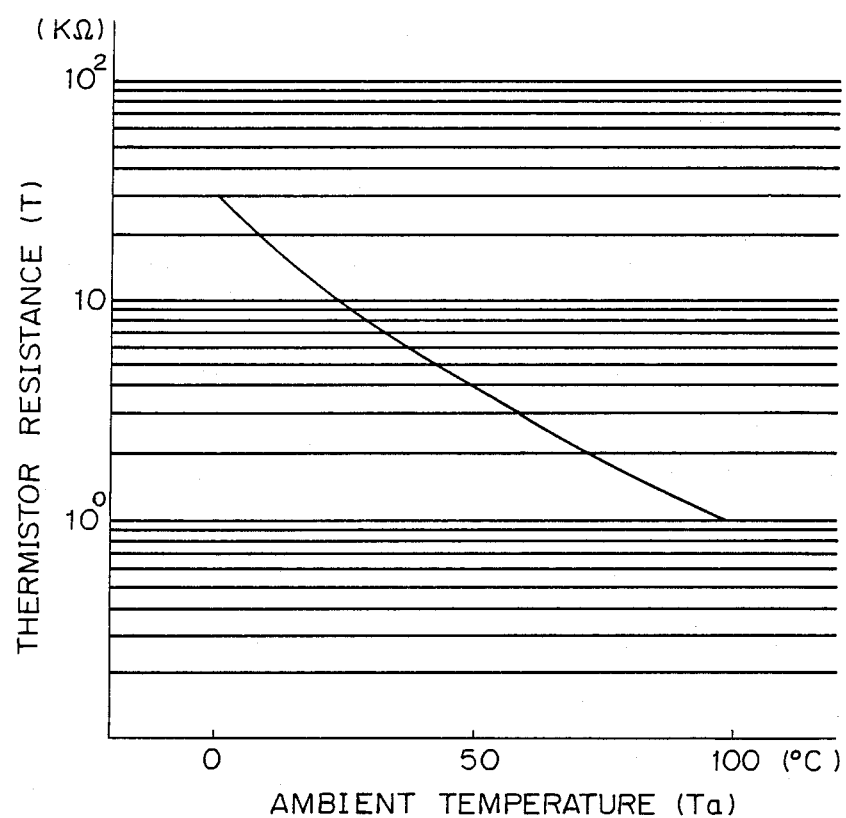
FIG. 3 is a plot representative of temperature dependence of the resistance of a thermistor which serves as a temperature sensor.

As shown in FIG. 3, the resistance of the thermistor 30 is highly susceptible even to a slight change of temperature. As shown in FIG. 2, the thermistor 30 is located in the vicinity of the laser unit 20 and rigidly mounted on the heat absorbing and radiating arrangement 32 via the heat absorbing end plate 34. In this construction, the laser unit 20 is heated and cooled depending upon the direction of the current which is applied to the arrangement 32.

The decision circuit 18 identifies one of three different stages to which an instantaneous temperature condition belongs, in terms of the resistance of the thermistor 30. The resulting information from the decision circuit 18 is fed to the second feedback circuit 16. Specifically, when the ambient temperature Ta is lowered beyond the lower limit $T_1$ which is 0° C., a current is fed to the heat absorbing and radiating arrangement 32 to control the resistance of the thermistor 30 to 30 kiloohms and thereby to heat the laser unit 20. Conversely, when the ambient temperature Ta is elevated beyond the upper limit $T_2$ which is 60° C., a current is fed to the arrangement 32 in the opposite direction to the above-mentioned to thereby cool the laser unit 20. While the ambient temperature Ta is settled within the range of 0° C. to 60° C., only the first feedback circuit 14 functions to stabilize the optical output with no current fed to the arrangement 32.

With the above construction, the optical transmission apparatus is operable over an extended ambient temperature range which is −40° C. to 85° C. In addition, since the current which should be fed to the heat absorbing and radiating arrangement 32 is as small as about 0.5 ampere which is approximately one half the conventional current, promoting the cut-down of power consumption. The resistance of the thermistor 30 is divided stepwise into three stages so that the decision circuit 18 decides which of the commands associated with the three stages should be responded; the values associated with $T_1$ and $T_2$ should only be determined on the basis of the temperature range to be adopted. Typical of temperature control methods known in the art is a method which uses a bridge circuit.

Figure 4:
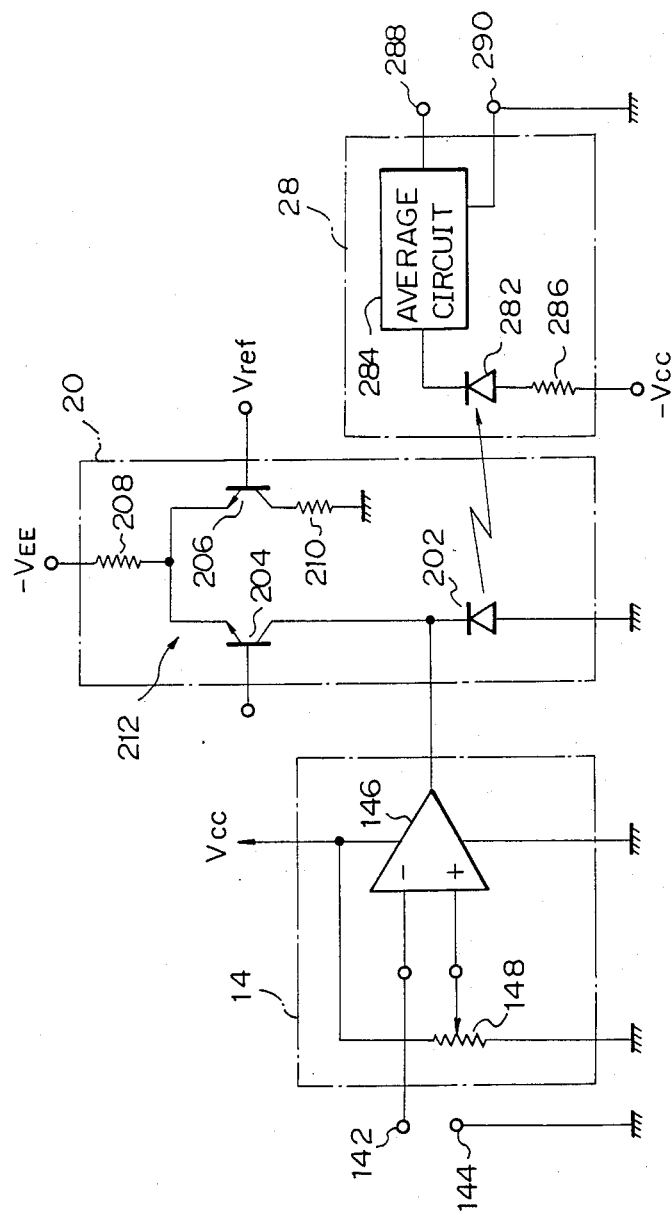
FIG. 4 is a circuit diagram showing specific constructions of a semiconductor laser unit, photosensor and first feedback circuit which are included in the apparatus of FIG. 1.

Referring to FIG. 4, specific constructions of the laser unit 20, photosensor 28 and firt feedback circuit 14 are shown. As shown, the laser unit 20 is made up of a laser or light emitting element 202, and a control circuit 212 for controlling a beam issuing from the laser 202 in response to input data. The control circuit 212 is constituted by transistors 204 and 206 and resistors 208 and 210. The photosensor 28 is made up of a photoelectric transducer or light-sensitive element 282 to which the beam from the laser 202 is incident, an averaging circuit 284 for averaging electric outputs of the light-sensitive element 282, and a resistor 286. Further, the first feedback circuit 14 is made up of an operational amplifier (OP AMP) 146 to which an averaged output appearing on terminals 288 and 290 of the averaging circuit 284 is fed to the terminals 142 and 144, and a potentiometer 148 for applying a reference voltage to the OP AMP 146. The OP AMP 146 generates an output signal responsive to the voltage appearing on the terminals 142 and 144. The OP AMP 146 reduces its output current by increasing the voltage to the terminals 142 and 144, and increases the current by reducing the voltage to the terminals. That is, when the optical output of the laser unit 20 is increased (reduced), the OP AMP 146 reduces (increases) the current fed to the laser unit 20 and thereby the output of the laser unit 20 resulting in the output of the laser unit 20 being kept constant.

Figure 5:
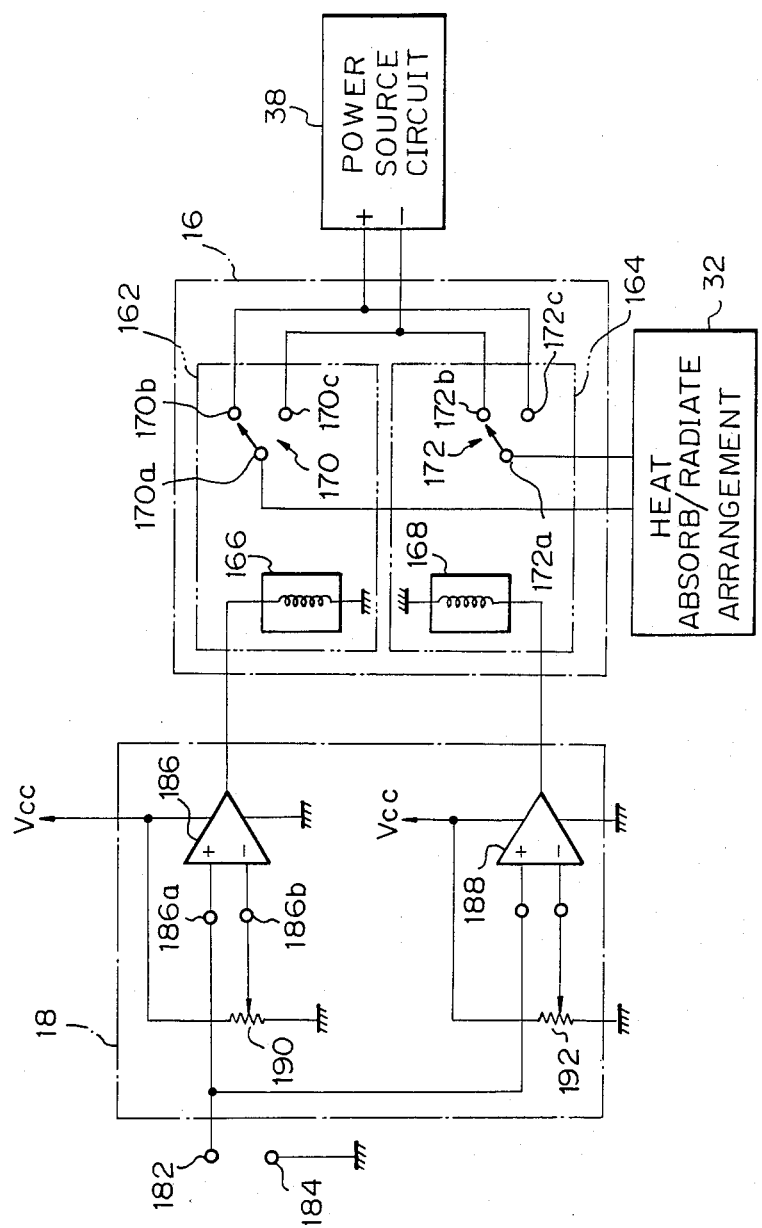
FIG. 5 is a circuit diagram showing specific constructions of a second feedback circuit and decision circuit which are also included in the apparatus of FIG. 1.

FIG. 5 shows specific constructions of the second feedback circuit 16 and decision circuit 18. The decision circuit 18 comprises two OP AMPs 186 and 188 to which an output of the thermistor 30 is fed via terminals 182 and 184, and potentiometers 190 and 192 adapted to apply reference voltages to the OP AMPs 186 and 188, respectively. The second feedback circuit 16 comprises relays 162 and 164 to which outputs of the OP AMPs 186 and 188 are respectively fed. While the relay 162 is constituted by a relay coil 166 and a relay contact 170, the relay 164 is made up of a relay 168 and a relay contact 172. Movable contacts 170a and 172a of the relay contacts 170 and 172, respectively are connected to the heat absorbing and generating arrangement 32, and stationary contacts 170b and 172b of the same are connected to a power source circuit 38 as shown in the figure.

In FIG. 5, assume that the temperature of the laser unit 20 is elevated until a relationship of $T_a > T_2$ holds. Then, the resistance of the thermistor 30 decreases with the result that the potetial difference between the input terminals 186a and 186b of the OP AMP 186 is increased. Consequently, the output voltage of the OP AMP 186 is increased to trigger the relay 162 so that a current is fed from the power source circuit 38 to the heat absorbing and generating arrangement 32. At this instant, the movable contact 170a of the relay 170 is connected to the stationary contact 170b while, at the same time, the movable contact 172a of the relay 172 is connected to the stationary contact 172b. However, while the ambient temperature Ta remains between $T_1$ and $T_2$, i.e., $T_1 < T_a < T_2$, the output voltages of the OP AMPs 186 and 188 are lowered compared to the case wherein $T_a > T_2$ holds, resulting in one of the relays 162 and 164 becoming inoperative. Specifically, since the movable contact 170a of the relay 162 is connected to the stationary contact 170c and the movable contact 172a of the relay 164 is connected to the stationary contact 172b, no current is fed from the power source circuit 38 to the arrangement 32. Further, when a relation $T_a < T_1$ holds, the movable contacts 170a and 172a of the relays 162 and 164, respectively, are respectively connected to the stationary contacts 170c and 172c. As a result, a current is fed from the power source 38 to the arrangement 32 in the opposite direction. In this manner, the Peltier-effect elements of the arrangement 32 absorb and radiate heat selectively depending upon the direction of current, i.e., it absorbs heat under the condition of $T_a > T_2$ and radiates heat in the condition of $T_a < T_1$.

In summary, it will be seen that the present invention provides an optical communication apparatus which realizes an unprecedented operable temperature range and halves the power consumption by a heat absorbing and radiating arrangement, by using the combination of control over an optical output and control over the temperature of a semiconductor laser. Moreover, even when the apparatus is used at temperatures ranging from $-40°$ C. to $85°$ C., its service life is extended because the operating temperature range of a semiconductor laser itself is $0°$ C. to $60°$ C.

Various modifications will become possible for those skilled in the art after receiving the teachings of the present disclosure without departing from the scope thereof. For example, the semiconductor light emitting element and the temperature sensor are not limited to a semiconductor laser and a thermistor, respectively. Hence, the specific resistance values used by the decision circuit 18 for evaluation may be changed depending upon the physical quantity which is produced by the temperature sensor in response to a change of ambient temperature. Further, the specific numerical values have been used for illustration only.

The first feedback circuit 14 adapted for optical output control and the second feedback circuit 16 may be enabled when the ambient temperature Ta lies in the range of $0°$ C. to $60°$ C. and in the other ranges, respectively, conversely to the relationship shown and described. Specifically, in a modification shown in FIG. 6, an optical transmission apparatus 10A is constructed such that the second feedback circuit 16 is enabled when the ambient temperature is $0°$ C. to $60°$ C. so as to control the semiconductor laser to a certain temperature while, when the ambient temperature is brought out of that range, the first feedback circuit 14 is enabled together with the circuit 16 by an output of the decision circuit 18. In this case, although the temperature of the laser unit 20 increases and decreases beyond the predetermined level, the stability of optical output is not affected at all.

What is claimed is:

1. An optical transmission apparatus comprising:
   light emitting means for outputting coherent light;
   output light control means including a first feedback circuit and a photosensor for stabilizing the light output by said light emitting means by sensing a part of said light;
   temperature sensor means for sensing an ambient temperature
   temperature control means including a second feedback circuit and a heat transfer means, said temperature control means being responsive to said ambient temperature sensed by said temperature sensor means for controlling the temperature of said light emitting means; and
   decision means for determining whether the temperature sensed by said temperature sensor means lies in a predetermined temperature range and for determining which one of said light control means or temperature control means should have priority; said decision means further identifying any one of three different stages to which the temperature of the light emitting means belongs such that information from said decision means is fed to at least one of the first and second feedback circuits to stabilize the output of the light emitting means.

2. An apparatus as claimed in claim 1, wherein said decision means is operatively connected to said temperature control means so that when the decision means determines that the temperature sensed by said temperature sensor means is out of the predetermined temperature range, said temperature control means operates to bring the temperature back into the predetermined temperature range.

3. An apparatus as claimed in claim 1, wherein said decision means renders inoperative said heat transfer means when the temperature sensed by said temperature sensor means lies in the predetermined temperature range and renders operative said heat transfer means when said temperature is out of said predetermined temperature range.

4. An apparatus as claimed in claim 1, wherein said light emitting means comprises a semiconductor laser.

5. An apparatus as claimed in claim 1, wherein said temperature sensor means comprises a thermistor.

6. An optical transmission apparatus comprising:
a light emitting device for emitting coherent light;
a first control arrangement including a first feedback circuit and a photosensor coupled to the light emitting device to stabilize the light output by the light emitting device when an ambient temperature is within a predetermined temperature range;
a heat transfer device thermally coupled to the light emitting device; and
a second control arrangement thermally coupled to the light emitting device and a second feedback circuit coupled to the heat transfer device so the heat transfer device supplies heat to the light emitting device when the temperature is below the predetermined range, removes heat from the light emitting device when the temperature is above the predetermined range, and is inoperative when the temperature is within the predetermined range.

7. An apparatus as claimed in claim 6, wherein the light emitting device comprises a semi-conductor laser.

8. An apparatus as claimed in claim 6, wherein the first control arrangement includes a photosensor optically coupled to the light emitting device.

9. An apparatus as claimed in claim 8, wherein the first control arrangement further includes circuitry electrically coupled to the photosensor and the light emitting device for increasing and decreasing the drive current to the light emitting device to maintain the light emitted by the light emitting device constant.

10. An apparatus as claimed in claim 6, wherein the heat transfer device includes at least one Peltier-effect element.

11. An apparatus as claimed in claim 6, wherein the second control arrangement includes a temperature sensor thermally coupled to the light emitting device.

12. An apparatus as claimed in claim 11, wherein the temperature sensor comprises a thermistor.

13. An apparatus as claimed in claim 11, wherein the second control arrangement further includes circuitry electronically coupled to the temperature sensor and the heat transfer device for determining whether the temperature is below, within, or above the predetermined temperature range.

14. An apparatus as claimed in claim 13, wherein the heat transfer device includes at least one Peltier-effect element and wherein the circuitry includes a power source and a relay arrangement operatively connected between the power source and the Peltier-effect element to supply current in one direction from the power source to the Peltier-effect element if the temperature is below the predetermined temperature range, to supply current in the opposite direction from the power source to the Peltier-effect element if the temperature is above the predetermined temperature range, and to supply no current from the power source to the Peltier-effect element if the temperature is within the predetermined temperature range.

15. An apparatus as claimed in claim 6, wherein the light emitting device comprises a semi-conductor laser, wherein the first feedback circuit includes circuitry for increasing and decreasing drive current to the light emitting device to maintain the optical output constant, wherein the heat transfer device includes at least one Peltier-effect element, wherein the temperature sensor includes a thermistor, and wherein the second control arrangement includes circuitry electronically coupled to the thermistor for determining whether the temperature is below, within, or above the predetermined temperature range, the circuitry including a power source and a relay arrangement coupled between the power source and the Peltier-effect element to supply current in one direction from the power source to the Peltier-effect element when the temperature is below the predetermined temperature range, to supply current in the opposite direction from the power source to the Peltier-effect element when the temperature is above the predetermined temperature range, and to supply no current from the power source to the Peltier-effect element when the temperature is within the predetermined temperature range.

16. An optical transmission apparatus comprising:
a light emitting device for emitting coherent light;
a photosensor optically coupled to the light emitting device for sensing at least a part of the emitted light;
a temperature sensor thermally coupled to the light emitting device for sensing the temperature of the light emitting device;
a heat transfer device thermally coupled to the light emitting device for supplying heat to the light emitting device and for removing heat from the light emitting device; and
a control arrangement including decision circuitry connected to the temperature sensor for determining whether the sensed temperature is below, within, or above a predetermined temperature range and a first feedback circuit coupled to the photosensor and the light emitting device and a second feedback circuit coupled to the heat transfer device for stabilizing the light emitted by the light emitting device, causing the heat transfer device to supply heat to the light emitting device, and causing the heat transfer device to remove heat from the light emitting device in accordance with the determination of the decision circuitry.

17. An apparatus as claimed in claim 20 wherein the second feedback circuit causes the heat transfer device to supply heat to the light emitting device when the decision circuitry determines that the sensed temperature is below the predetermined temperature range, causes the heat transfer device to remove heat from the light emitting device when the decision circuitry determines that the sensed temperature is above the predetermined temperature range, and causes the heat transfer device to be inoperative when the decision circuitry determines that the sensed temperature is within the predetermined temperature range.

18. An apparatus as claimed in claim 16 wherein the second feedback circuit causes the heat transfer device to supply heat to the light emitting device when the decision circuitry determines that the sensed temperature is below the predetermined temperature range.

19. An apparatus as claimed in claim 17 wherein the second feedback circuit causes the heat transfer device to remove heat from the light emitting device when the decision circuitry determines that the sensed temperature is above the predetermined temperature range.

* * * * *